US012604468B2

(12) United States Patent (10) Patent No.: US 12,604,468 B2

Purayath et al. (45) Date of Patent: Apr. 14, 2026

(54) VERTICAL NOR MEMORY STRINGS AND METHOD FOR FABRICATION THEREOF

(71) Applicant: SUNRISE MEMORY CORPORATION, San Jose, CA (US)

(72) Inventors: Vinod Purayath, Sedona, AZ (US); Kenta Ohama, Tokyo (JP); Yosuke Nosho, Tokyo (JP)

(73) Assignee: SUNRISE MEMORY CORPORATION, San Jose, CA (US)

( * ) Notice: Subject to any disclaimer, the term of this patent is extended or adjusted under 35 U.S.C. 154(b) by 662 days.

(21) Appl. No.: 17/559,101

(22) Filed: Dec. 22, 2021

(65) Prior Publication Data

US 2022/0231040 A1 Jul. 21, 2022

Related U.S. Application Data

(60) Provisional application No. 63/139,435, filed on Jan. 20, 2021.

(51) Int. Cl.
H10B 43/20 (2023.01)
H10B 43/40 (2023.01)

(52) U.S. Cl.
CPC ............. H10B 43/20 (2023.02); H10B 43/40 (2023.02)

(58) Field of Classification Search
CPC ........ H10B 43/20; H10B 43/27; H10B 43/40; H10B 43/50
See application file for complete search history.

(56) References Cited

U.S. PATENT DOCUMENTS

| | | | |
|---|---|---|---|
| 4,213,139 | A | 7/1980 | Rao |
| 5,583,808 | A | 12/1996 | Brahmbhatt |
| 5,646,886 | A | 7/1997 | Brahmbhatt |
| 5,656,842 | A | 8/1997 | Iwamatsu |
| 5,768,192 | A | 6/1998 | Eitan |

(Continued)

FOREIGN PATENT DOCUMENTS

| | | |
|---|---|---|
| CN | 111799263 A | 10/2020 |
| JP | 1998-269789 A2 | 10/1998 |

(Continued)

OTHER PUBLICATIONS

Wu, Jixuan , et al., "A Monolithic 3D Integration of RRAM Array with Oxide Semiconductor FET for In-Memory Computing in Quantized Neural Network AI Applications", 2020 IEEE Symposium on VLSI Technology Digest of Technical Papers, Honolulu, HI, USA, Jun. 2020, 4 pages.

(Continued)

*Primary Examiner* — Yara B Green
*Assistant Examiner* — Coralie A Nettles

(57) ABSTRACT

A VNOR memory string includes: (a) first and second pillars embedded in multiple composite layers, each composite layer comprising an insulator layer and a conductor layer, the first and second pillars each comprising a first semiconductor material of a first conductivity; (b) a second semiconductor layer of a second conductivity type opposite the first conductivity type on the outside of third pillar also embedded in the composite layers, the third pillar contacting both the first and second pillars; and (c) a storage layer provided between the second semiconductor layer and each of the conductor layer in the composite layers.

13 Claims, 10 Drawing Sheets

(56) References Cited

U.S. PATENT DOCUMENTS

| | | | |
|---|---|---|---|
| 5,789,776 | A | 8/1998 | Lancaster et al. |
| 5,880,993 | A | 3/1999 | Kramer et al. |
| 5,915,167 | A | 6/1999 | Leedy |
| 6,040,605 | A | 3/2000 | Sano et al. |
| 6,107,133 | A | 8/2000 | Furukawa et al. |
| 6,118,171 | A | 9/2000 | Davies et al. |
| 6,130,838 | A | 10/2000 | Kim et al. |
| 6,314,046 | B1 | 11/2001 | Kamiya et al. |
| 6,362,508 | B1 | 3/2002 | Rasovaky et al. |
| 6,434,053 | B1 | 8/2002 | Fujiwara |
| 6,580,124 | B1 | 6/2003 | Cleeves et al. |
| 6,587,365 | B1 | 7/2003 | Salling |
| 6,744,094 | B2 | 6/2004 | Forbes |
| 6,774,458 | B2 | 8/2004 | Fricke et al. |
| 6,873,004 | B1 | 3/2005 | Han et al. |
| 6,881,994 | B2 | 4/2005 | Lee et al. |
| 6,946,703 | B2 | 9/2005 | Ryu et al. |
| 7,005,350 | B2 | 2/2006 | Walker et al. |
| 7,223,653 | B2 | 5/2007 | Cheng et al. |
| 7,307,308 | B2 | 12/2007 | Lee |
| 7,426,141 | B2 | 9/2008 | Takeuchi |
| 7,489,002 | B2 | 2/2009 | Forbes et al. |
| 7,495,963 | B2 | 2/2009 | Edahiro et al. |
| 7,524,725 | B2 | 4/2009 | Chung |
| 7,542,348 | B1 | 6/2009 | Kim |
| 7,612,411 | B2 | 11/2009 | Walker |
| 7,876,614 | B2 | 1/2011 | Kang et al. |
| 8,026,521 | B1 | 9/2011 | Or-Bach et al. |
| 8,139,418 | B2 | 3/2012 | Carman |
| 8,178,396 | B2 | 5/2012 | Sinha et al. |
| 8,278,183 | B2 | 10/2012 | Lerner |
| 8,395,942 | B2 | 3/2013 | Samachisa et al. |
| 8,630,114 | B2 | 1/2014 | Lue |
| 8,767,473 | B2 | 7/2014 | Shim et al. |
| 8,848,425 | B2 | 9/2014 | Schloss |
| 8,878,278 | B2 | 11/2014 | Alsmeier et al. |
| 9,105,310 | B2 | 8/2015 | Li et al. |
| 9,158,622 | B2 | 10/2015 | Lee et al. |
| 9,190,293 | B2 | 11/2015 | Wang et al. |
| 9,202,694 | B2 | 12/2015 | Konevecki et al. |
| 9,230,985 | B1 | 1/2016 | Wu et al. |
| 9,412,752 | B1 | 8/2016 | Yeh et al. |
| 9,455,268 | B2 | 9/2016 | Oh et al. |
| 9,620,605 | B2 | 4/2017 | Liang et al. |
| 9,633,944 | B2 | 4/2017 | Kim |
| 9,748,172 | B2 | 8/2017 | Takaki |
| 9,799,761 | B2 | 10/2017 | Or-Bach et al. |
| 9,842,651 | B2 | 12/2017 | Harari |
| 9,892,800 | B2 | 2/2018 | Harari |
| 9,911,497 | B1 | 3/2018 | Harari |
| 10,074,667 | B1 | 9/2018 | Higashi |
| 10,096,364 | B2 | 10/2018 | Harari |
| 10,121,553 | B2 | 11/2018 | Harari |
| 10,157,780 | B2 | 12/2018 | Wu et al. |
| 10,249,370 | B2 | 4/2019 | Harari |
| 10,254,968 | B1 | 4/2019 | Gazit et al. |
| 10,283,493 | B1 | 5/2019 | Nishida |
| 10,373,956 | B2 | 8/2019 | Gupta et al. |
| 10,381,370 | B2 | 8/2019 | Shin et al. |
| 10,381,378 | B1 | 8/2019 | Harari |
| 10,395,737 | B2 | 8/2019 | Harari |
| 10,431,596 | B2 | 10/2019 | Herner et al. |
| 10,475,812 | B2 | 11/2019 | Harari |
| 10,622,377 | B2 | 4/2020 | Harari et al. |
| 10,651,153 | B2 | 5/2020 | Fastow et al. |
| 10,692,874 | B2 | 6/2020 | Harari et al. |
| 11,069,410 | B1 * | 7/2021 | Cui .................. G11C 11/005 |
| 2001/0030340 | A1 | 10/2001 | Fujiwara |
| 2001/0053092 | A1 | 12/2001 | Kosaka et al. |
| 2002/0012271 | A1 | 1/2002 | Forbes |
| 2002/0028541 | A1 | 3/2002 | Lee et al. |
| 2002/0051378 | A1 | 5/2002 | Ohsawa |
| 2002/0193484 | A1 | 12/2002 | Albee |
| 2003/0038318 | A1 | 2/2003 | Forbes |
| 2004/0214387 | A1 | 10/2004 | Madurawe et al. |
| 2004/0246807 | A1 | 12/2004 | Lee |
| 2004/0262681 | A1 | 12/2004 | Masuoka et al. |
| 2004/0262772 | A1 | 12/2004 | Ramanathan et al. |
| 2004/0264247 | A1 | 12/2004 | Kim |
| 2005/0128815 | A1 | 6/2005 | Ishikawa et al. |
| 2005/0218509 | A1 | 10/2005 | Kipnis et al. |
| 2005/0280061 | A1 | 12/2005 | Lee |
| 2006/0001083 | A1 | 1/2006 | Bhattacharyya |
| 2006/0140012 | A1 | 6/2006 | Wan et al. |
| 2006/0155921 | A1 | 7/2006 | Gorobets et al. |
| 2006/0261404 | A1 | 11/2006 | Forbes |
| 2007/0023817 | A1 | 2/2007 | Dao |
| 2007/0045711 | A1 | 3/2007 | Bhattacharyya |
| 2007/0134876 | A1 | 6/2007 | Lai et al. |
| 2008/0178794 | A1 | 7/2008 | Cho et al. |
| 2008/0212358 | A1 | 9/2008 | Mitsui |
| 2008/0239812 | A1 | 10/2008 | Naofumi et al. |
| 2008/0301359 | A1 | 12/2008 | Smith |
| 2009/0057722 | A1 | 3/2009 | Masuoka et al. |
| 2009/0135651 | A1 | 5/2009 | Kojima et al. |
| 2009/0157946 | A1 | 6/2009 | Arya |
| 2009/0237996 | A1 | 9/2009 | Kirsch et al. |
| 2009/0242966 | A1 | 10/2009 | Son et al. |
| 2009/0279360 | A1 | 11/2009 | Peter et al. |
| 2009/0290442 | A1 | 11/2009 | Rajan |
| 2009/0316487 | A1 | 12/2009 | Lee et al. |
| 2010/0121994 | A1 | 5/2010 | Kim et al. |
| 2010/0124116 | A1 | 5/2010 | Takashi et al. |
| 2010/0128509 | A1 | 5/2010 | Kim et al. |
| 2010/0213527 | A1 | 8/2010 | Shim et al. |
| 2010/0219392 | A1 | 9/2010 | Awaya et al. |
| 2010/0254191 | A1 | 10/2010 | Son et al. |
| 2011/0044113 | A1 | 2/2011 | Kim |
| 2011/0073866 | A1 * | 3/2011 | Kim ..................... H10B 43/27 |
| | | | 257/326 |
| 2011/0115011 | A1 | 5/2011 | Masuoka et al. |
| 2011/0134705 | A1 | 6/2011 | Jones et al. |
| 2011/0170266 | A1 | 7/2011 | Haensh et al. |
| 2011/0208905 | A1 | 8/2011 | Shaeffer et al. |
| 2011/0291176 | A1 | 12/2011 | Lee et al. |
| 2011/0298013 | A1 | 12/2011 | Hwang et al. |
| 2011/0310683 | A1 | 12/2011 | Gorobets |
| 2012/0182801 | A1 | 7/2012 | Lue |
| 2012/0243314 | A1 | 9/2012 | Takashi |
| 2012/0307568 | A1 | 12/2012 | Banna et al. |
| 2013/0031325 | A1 | 1/2013 | Nakamoto et al. |
| 2013/0256780 | A1 | 10/2013 | Kai et al. |
| 2014/0015036 | A1 | 1/2014 | Fursin et al. |
| 2014/0040698 | A1 | 2/2014 | Loh et al. |
| 2014/0070289 | A1 | 3/2014 | Tanaka et al. |
| 2014/0075135 | A1 | 3/2014 | Choi et al. |
| 2014/0112075 | A1 | 4/2014 | Dunga et al. |
| 2014/0117366 | A1 | 5/2014 | Saitoh |
| 2014/0151774 | A1 | 6/2014 | Rhie |
| 2014/0229131 | A1 | 8/2014 | Cohen et al. |
| 2014/0247674 | A1 | 9/2014 | Karda et al. |
| 2014/0328128 | A1 | 11/2014 | Louie et al. |
| 2014/0340952 | A1 | 11/2014 | Ramaswamy et al. |
| 2015/0054507 | A1 | 2/2015 | Gulaka et al. |
| 2015/0098272 | A1 | 4/2015 | Kasolra et al. |
| 2015/0113214 | A1 | 4/2015 | Sutardja |
| 2015/0155876 | A1 | 6/2015 | Jayasena et al. |
| 2015/0194440 | A1 | 7/2015 | Noh et al. |
| 2015/0249143 | A1 | 9/2015 | Sano |
| 2015/0263005 | A1 | 9/2015 | Zhao et al. |
| 2015/0372099 | A1 | 12/2015 | Chen et al. |
| 2016/0013156 | A1 | 1/2016 | Zhai et al. |
| 2016/0019951 | A1 | 1/2016 | Park et al. |
| 2016/0035711 | A1 | 2/2016 | Hu |
| 2016/0086970 | A1 | 3/2016 | Peng |
| 2016/0225860 | A1 | 8/2016 | Karda et al. |
| 2016/0276360 | A1 | 9/2016 | Doda et al. |
| 2016/0300724 | A1 | 10/2016 | Levy et al. |
| 2016/0314042 | A1 | 10/2016 | Plants |
| 2017/0092370 | A1 | 3/2017 | Harari |
| 2017/0092371 | A1 | 3/2017 | Harari |
| 2017/0148517 | A1 | 5/2017 | Harari |
| 2017/0148810 | A1 | 5/2017 | Kai et al. |
| 2017/0213821 | A1 | 7/2017 | Or-Bach et al. |

(56) References Cited

U.S. PATENT DOCUMENTS

| | | | |
|---|---|---|---|
| 2017/0358594 A1 | 12/2017 | Lu et al. | |
| 2018/0095127 A1 | 4/2018 | Pappu et al. | |
| 2018/0108416 A1 | 4/2018 | Harari | |
| 2018/0261613 A1 | 9/2018 | Ariyoshi et al. | |
| 2018/0269229 A1 | 9/2018 | Or-Bach et al. | |
| 2018/0286918 A1 | 10/2018 | Bandyopadhyay et al. | |
| 2018/0330791 A1 | 11/2018 | Li et al. | |
| 2018/0331042 A1 | 11/2018 | Manusharow et al. | |
| 2018/0366471 A1 | 12/2018 | Harari et al. | |
| 2018/0366485 A1 | 12/2018 | Harari | |
| 2018/0366489 A1 | 12/2018 | Harari et al. | |
| 2019/0006009 A1 | 1/2019 | Harari | |
| 2019/0019564 A1 | 1/2019 | Li et al. | |
| 2019/0067327 A1 | 2/2019 | Herner et al. | |
| 2019/0148286 A1 | 5/2019 | Or-Bach et al. | |
| 2019/0157296 A1 | 5/2019 | Harari et al. | |
| 2019/0180821 A1 | 6/2019 | Harari | |
| 2019/0206890 A1 | 7/2019 | Harari et al. | |
| 2019/0214077 A1 | 7/2019 | Oh et al. | |
| 2019/0238134 A1 | 8/2019 | Lee et al. | |
| 2019/0244971 A1 | 8/2019 | Harari | |
| 2019/0259769 A1 | 8/2019 | Karda et al. | |
| 2019/0303042 A1 | 10/2019 | Kim et al. | |
| 2019/0304988 A1 | 10/2019 | Dong et al. | |
| 2019/0319044 A1 | 10/2019 | Harari | |
| 2019/0325945 A1 | 10/2019 | Linus | |
| 2019/0325964 A1 | 10/2019 | Harari | |
| 2019/0348424 A1 | 11/2019 | Karda et al. | |
| 2019/0355747 A1 | 11/2019 | Herner et al. | |
| 2019/0370117 A1 | 12/2019 | Fruchtman et al. | |
| 2020/0051990 A1 | 2/2020 | Harari et al. | |
| 2020/0063263 A1 | 2/2020 | Yang et al. | |
| 2020/0098738 A1 | 3/2020 | Herner et al. | |
| 2020/0098779 A1 | 3/2020 | Cernea et al. | |
| 2020/0098881 A1 | 3/2020 | Vellianitis | |
| 2020/0176468 A1 | 6/2020 | Herner et al. | |
| 2020/0258897 A1 | 8/2020 | Yan et al. | |
| 2020/0350234 A1 | 11/2020 | Shan et al. | |
| 2020/0357822 A1 | 11/2020 | Chen | |
| 2021/0013224 A1 | 1/2021 | Purayath et al. | |
| 2021/0074726 A1* | 3/2021 | Lue | H10B 51/30 |
| 2021/0175251 A1 | 6/2021 | Zhang et al. | |
| 2021/0375933 A1* | 12/2021 | Lu | H10B 51/20 |
| 2022/0139933 A1 | 5/2022 | Noack | |
| 2022/0199639 A1* | 6/2022 | Yeh | H10B 41/27 |
| 2022/0231049 A1 | 7/2022 | Lin et al. | |
| 2022/0246766 A1 | 8/2022 | Manfrini et al. | |
| 2022/0254390 A1 | 8/2022 | Gans et al. | |
| 2022/0351776 A1 | 11/2022 | Nam et al. | |
| 2022/0384459 A1 | 12/2022 | Lu et al. | |
| 2022/0393031 A1 | 12/2022 | Ando et al. | |
| 2023/0052477 A1 | 2/2023 | Ha et al. | |
| 2023/0269944 A1* | 8/2023 | Lue | H10B 43/27 |
| | | | 257/324 |

FOREIGN PATENT DOCUMENTS

| | | | |
|---|---|---|---|
| JP | 2000-243972 A2 | 9/2000 | |
| JP | 2000339978 A | 12/2000 | |
| JP | 2009206451 A1 | 9/2009 | |
| JP | 2010108522 A1 | 5/2010 | |
| JP | 2010251572 A | 11/2010 | |
| JP | 2011028540 A1 | 2/2011 | |
| JP | 2012-150876 A2 | 8/2012 | |
| KR | 20120085591 A1 | 8/2012 | |
| KR | 20120085603 A | 8/2012 | |
| WO | 2015025357 A1 | 2/2015 | |
| WO | 2018236937 A1 | 12/2018 | |

OTHER PUBLICATIONS

"PCT Search Report and Written Opinion, PCT/US2021/064844", Mar. 8, 2022, 15 paged.

"EP Extended Search Report EP168690149.3", Oct. 18, 2019.

"European Search Report, EP 16852238.1", Mar. 28, 2019.

"European Search Report, EP17844550.8", Aug. 12, 2020, 11 pages.

"Invitation to Pay Additional Fees (PCT/ISA/206), PCT/US2020/015710", Mar. 20, 2020, 2 pages.

"Notification of Reasons for Refusal, Japanese Patent Application 2018-527740", (English translation), Nov. 4, 2020, 8 pages.

"Partial European Search Report EP 16869049.3", Jul. 1, 2019, pp. 1-12.

"PCT Search Report and Written Opinion, PCT/US2018/038373", Sep. 10, 2018.

"PCT Search Report and Written Opinion, PCT/US2019/014319", Apr. 15, 2019.

"PCT Search Report and Written Opinion, PCT/US2019/052164", Feb. 27, 2020.

"PCT Search Report and Written Opinion, PCT/US2019/052446", Dec. 11, 2019.

"PCT Search Report and Written Opinion, PCT/US2020/015710", Jun. 9, 2020.

"PCT Search Report and Written Opinion, PCT/US2020/017494", Jul. 20, 2020, 13 pages.

"PCT Search Report and Written Opinion, PCT/US2020/065374", Mar. 15, 2021, 17 pages.

"PCT Search Report and Written Opinion, PCT/US2020/065670", Apr. 5, 2021, 12 pages.

"PCT Search Report and Written Opinion, PCT/US2021/016964", Jun. 15, 2021, 19 pages.

"PCT Search Report and Written Opinion, PCT/US2021/025722", Jun. 15, 2021, 10 pages.

Hiou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.

Kim, N. , et al., "Multi-layered Vertical gate NANO Flash Overcoming Stacking Limit for Terabit Density Storage", Symposium on VLSI Tech. Dig. of Technical Papers, 2009, pp. 188-189.

Lue, H.T. , et al., "A Highly Scalable 8-Layer 3D Vertical-gate {Vg} TFT NANO Flash Using Junction-Free Buried Channel BE-SONOS Device", Symposium on VLSI: Tech. Dig. of Technical Papers, 2010, pp. 131-132.

Tanaka, T. , et al., "A 768 GB 3b/cell 3D-Floaling-Gate NANO Flash Memory", Digest of Technical Papers, the 2016 EEE International Solid-Slate Circuits Conference, 2016, pp. 142-144.

Wann, H.C. , et al., "High-Endurance Ultra-Thin Tunnel Oxide in Monos Device Structure for Dynamic Memory Application", IEEE Electron Device letters, vol. 16, No. 11, Nov. 1995, pp. 491-493.

* cited by examiner

Figure (2g)

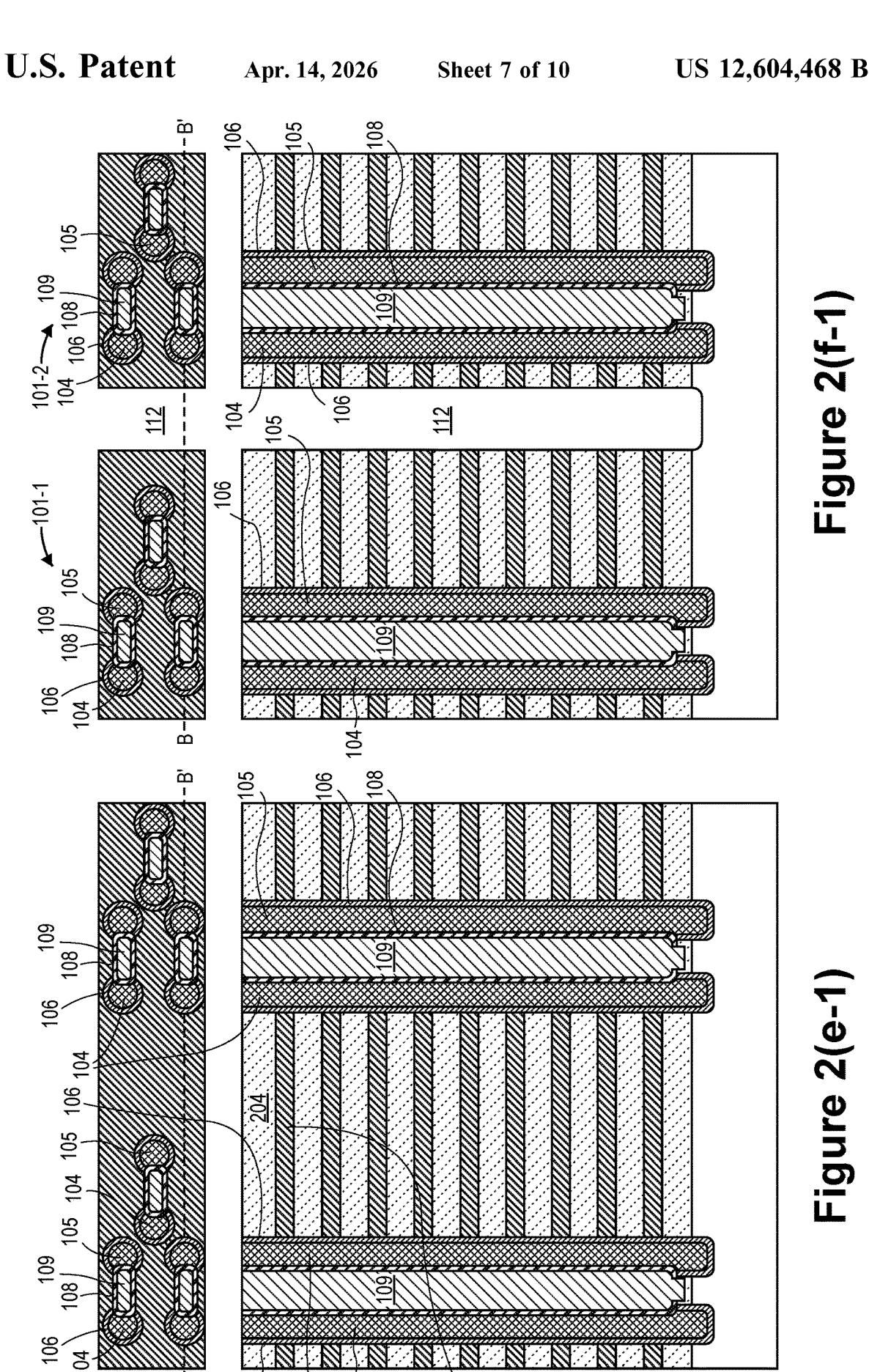
Figure 2(f-1)
Figure 2(e-1)

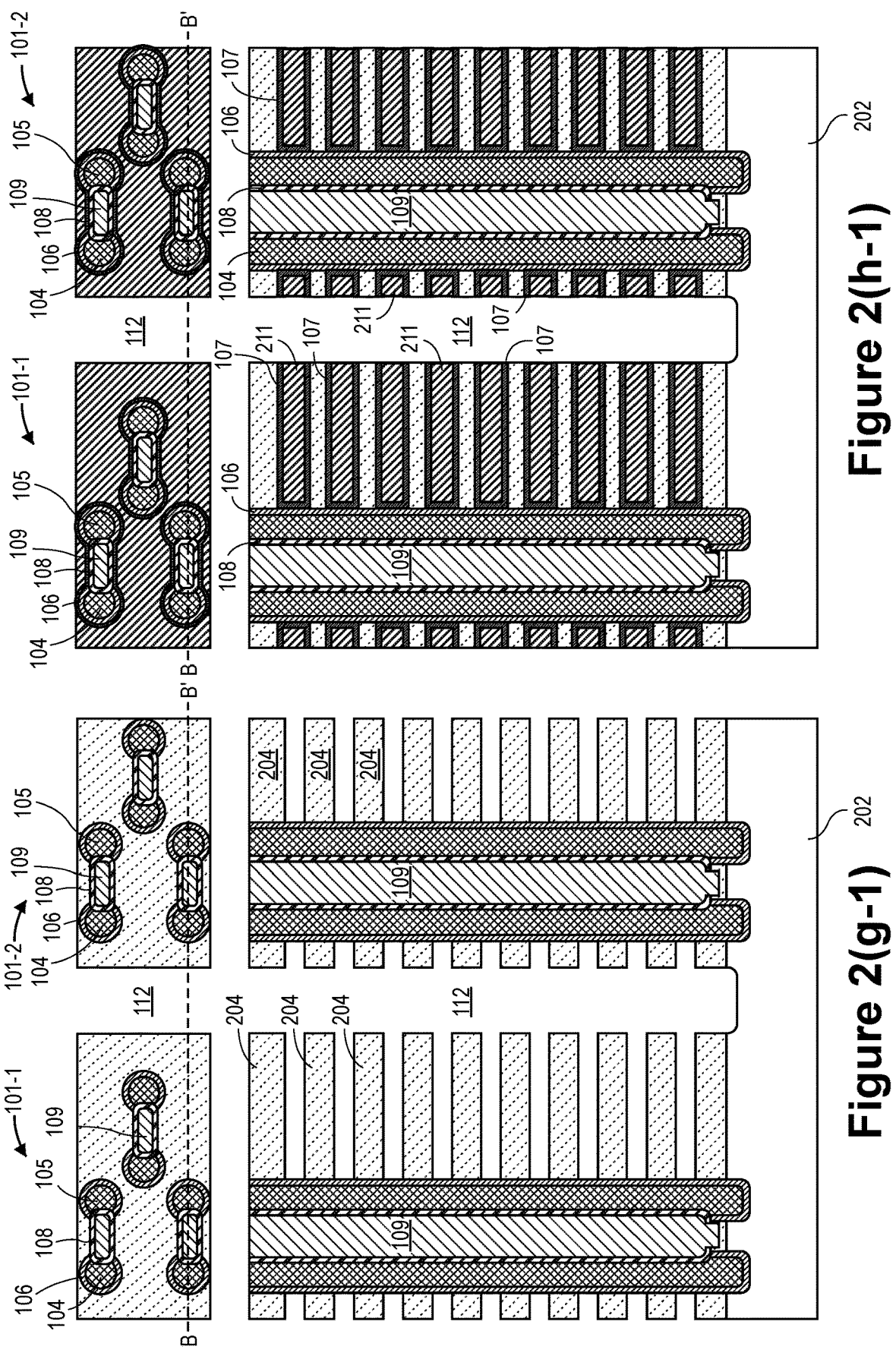
Figure 2(h-1)
Figure 2(g-1)

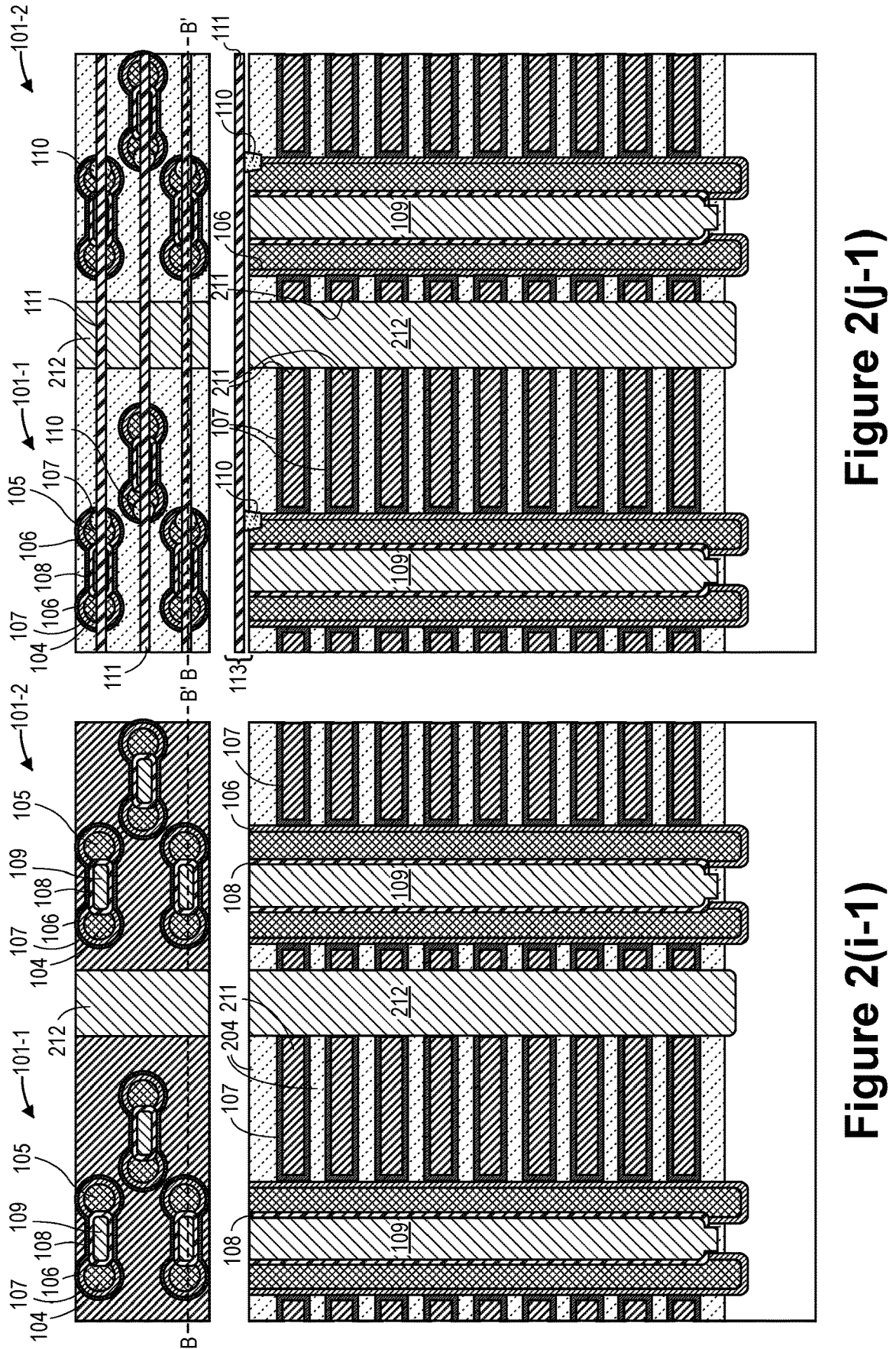
Figure 2(j-1)
Figure 2(i-1)

VERTICAL NOR MEMORY STRINGS AND METHOD FOR FABRICATION THEREOF

CROSS REFERENCE TO RELATED APPLICATIONS

The present application relates to and claims priority of U.S. provisional patent application ("Provisional Application"), Ser. No. 63/139,435, entitled "Vertical NOR Flash Thin film Transistor Strings and Fabrication Thereof," filed on Jan. 20, 2021. The disclosure of the Provisional Application is hereby incorporated by reference herein in its entirety.

BACKGROUND OF THE INVENTION

1. Field of the Invention

The present invention relates to high-density memory circuits. In particular, the present invention relates to 3-dimensional arrays of vertical NOR memory strings and fabrication processes for such 3-dimensional arrays.

2. Discussion of the Related Art

U.S. Pat. No. 10,790,023 ("the '023 patent"), entitled "Three-dimensional vertical NOR Flash Thin film Transistor Strings," filed on Jul. 3, 2019 and issued on Sep. 29, 2020, discloses a 3-dimensional array of thin-film storage transistors formed above a planar surface of a semiconductor substrate. The '023 patent's storage transistors are organized as NOR memory strings, arranged in rows and columns along orthogonal directions (the "horizontal" directions) that are substantially parallel to the planar surface of the semiconductor substrate. Each of the '023 patent's NOR memory strings include numerous storage transistors sharing a common bit line and a common source line, with the gate electrode of each storage transistor being controlled by a different word line. In examples illustrated in the '023 patent's, each NOR memory string has its common bit line and its common word line provided as polysilicon pillars that are lengthwise aligned substantially normal to the planar surface of the semiconductor substrate (the "vertical" direction), while the word lines are stacked along the vertical direction, each word line extending lengthwise along one of the horizontal directions. In this detailed description, NOR memory strings with the '023 patent's configuration of common bit line, common word line and word lines are referred to as "VNOR memory strings."

U.S. Pat. No. 10,748,629 ("the '629 patent"), Ser. No. 16/107,118, entitled "Capacitive-Coupled Non-Volatile Thin-Film Transistor Strings in Three-Dimensional Arrays," discloses NOR memory strings with horizontal common bit lines, horizontal common source lines and vertical word lines. In this detailed description, NOR memory strings with the '629 patent's configuration of common bit line, common word line and word lines are referred to as "HNOR memory strings."

VNOR memory strings and HNOR memory strings are both very high density non-volatile or quasi-volatile memory circuits. In this context, non-volatile memory circuits have data retention times in order of tens of years and beyond, while quasi-volatile memory circuits have data retention times between seconds and years. Efficient, reliable and high-yield manufacturing processes for manufacturing these memory circuits are desired.

SUMMARY

According to one embodiment of the present invention, a process for forming a VNOR memory string over a planar surface of a semiconductor substrate, includes: (a) providing multiple composite layers, each composite layer comprising an insulator layer and a sacrificial layer; (b) excavating first and second shafts in the composite layers; (c) lining the sidewalls of the first and second shafts with a second insulator; (d) filling the first and second shafts with a first semiconductor material of a first conductivity type; (e) excavating a slot through the composite layers between the first and second shafts, the excavating removing a portion of the first semiconductor material in each of the first and second shafts; (f) lining the slot conformally with a second semiconductor material of a second conductivity type opposite the first conductivity type; (g) filling the slot with a third insulator; (h) creating a trench through the multiple composite layers; (i) removing the sacrificial layer through the trench to create a space between adjacent insulator layers in the composite layers; (j) lining the space between the adjacent insulator layers with a conformal storage layer; and (k) filling the space between the adjacent insulator layers with a conductor. The insulator layers in the composite layers, the second insulator, and the third insulator each include silicon oxide. The first semiconductor material and the second semiconductor material may be $n^+$ polysilicon and $p^-$ polysilicon, respectively. The conductor may be metallic tungsten (W) in conjunction with a titanium nitride (TiN) liner.

The process of may further include: (a) providing an isolation layer over the first and second shafts; and forming a conductor-filled via in the isolation layer, the conductor-filled via contacting one of the first and second shafts. The process may further provide on the isolation layer a conductor that is in contact with the conductor-filled via. To avoid shorting to the top conductor layer in the composite layers, prior to forming conductor-filled via, the process may provide an etch-stop layer above the top conductor layer.

According to one embodiment of the present invention, a VNOR memory string includes: (a) first and second pillars embedded in multiple composite layers, each composite layer comprising an insulator layer and a conductor layer, the first and second pillars each comprising a first semiconductor material of a first conductivity; (b) a second semiconductor layer—either intrinsic or of a second conductivity type opposite the first conductivity type—on the outside of third pillar also embedded in the composite layers, the third pillar contacting both the first and second pillars; and (c) a storage layer provided between the second semiconductor layer and each of the conductor layer in the composite layers. The third pillar may include a second insulator layer enclosed by the second semiconductor layer. The first semiconductor material and the second semiconductor material may be $n^+$ polysilicon and p polysilicon, respectively. The conductor layers of the composite layers each include metallic tungsten (W) in conjunction with a titanium nitride (TiN) liner.

The present invention is better understood upon consideration of the detailed description below, in conjunction with the accompanying drawings.

BRIEF DESCRIPTION OF THE DRAWINGS

FIGS. 2(a), 2(b), 2(c), 2(d) 2(e), 2(f), 2(g), 2(h), 2(i) and 2(j) illustrate a process for fabricating modular circuits 101-1 and 101-2, according to one embodiment of the present invention.

FIGS. 2(e-1), 2(f-1), 2(g-1), 2(h-1), 2(i-1) and 2(j-1) show the alternative structures for the structures shown in FIGS. 2(e) to 2(j).

Figure 1:
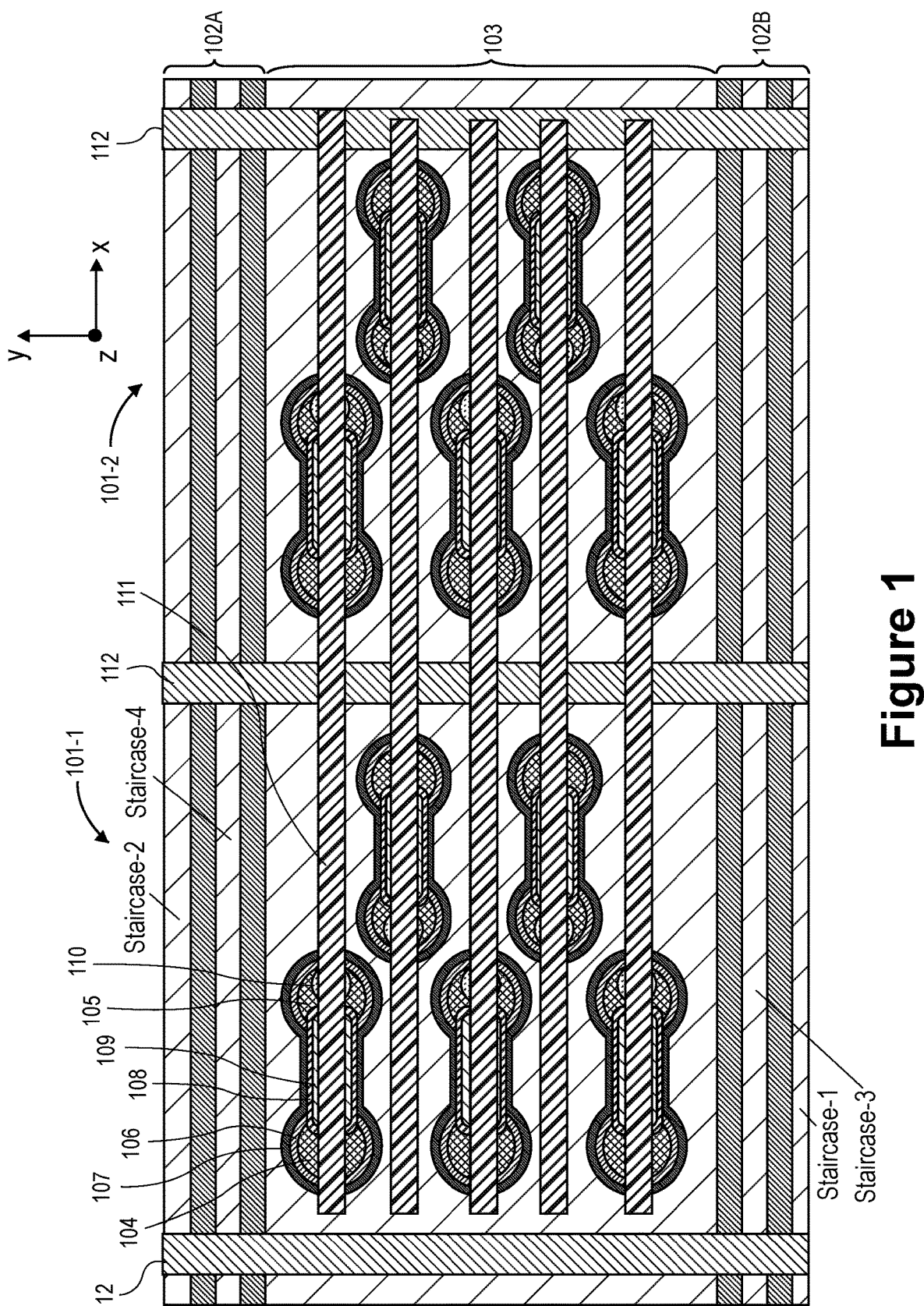
FIG. 1 is a top view of modular circuits 101-1 and 101-2 formed above a planar surface of a semiconductor substrate, each modular circuit including numerous VNOR memory strings, in accordance with one embodiment of the present invention.

For clarity, a Cartesian coordinate system is adopted to help orient these figures. Under this Cartesian coordinate system, the Z-direction is substantially normal to the planar surface of the semiconductor substrate, and the X- and Y-directions are substantially orthogonal to each other and each substantially orthogonal to the Z-direction (i.e., each substantially parallel to the planar surface of the semiconductor substrate).

To facilitate cross-reference across figures, like elements in the figures are assigned like reference numerals.

DETAILED DESCRIPTION OF THE PREFERRED EMBODIMENTS

FIG. 1 is a top view (i.e., in an X-Y plane) of modular circuits 101-1 and 101-2 formed above a planar surface of a semiconductor substrate, each modular circuit including numerous VNOR memory strings, in accordance with one embodiment of the present invention. As shown in FIG. 1, modular circuits 101-1 and 101-2, each bounded by isolation trenches ("slit trenches") 112 along the X-direction, and each including array portion 103 and staircase portions 102A and 102B. In this context, array portion 103 includes the numerous VNOR memory strings, while staircase portions 102A and 102B each include steps that allow access to the storage transistors of the VNOR memory strings through via connections which connect from one or more interconnection conductor layers to the word lines that control the storage transistors of each VNOR memory string. In one embodiment, staircase portion 102A has steps that allow via connections to word lines on even-numbered steps ($2^{nd}$, $4^{th}$, $6^{th}$, ... steps from the planar surface), while staircase portion 102B allow via connections to word lines on odd-numbered steps ($1^{st}$, $3^{rd}$, $5^{th}$, $7^{th}$ ... steps from the planar surface). FIG. 1 shows, merely for illustrative purpose, two staggered columns of VNOR memory strings (i.e., one column being offset from the other column by a given distance, such as 130 nm.) In FIG. 1, each of modular circuits 101-1 and 101-2 are implemented by a unit cell as a building block, which unit cell may be 160-nm wide along the Y-direction and 380 nm wide along the X-direction. Each VNOR memory string in the unit cell includes $n^+$ polysilicon pillars 104 and 105, each extending along the Z-direction down to the bottom of 3-dimensional array, at an insulation layer above the planar surface of the semiconductor substrate. Of course, both the number of VNOR memory strings and their respective dimensions are provided for illustrative purpose only. Any implementation may have any suitable number of VNOR memory strings in array portion 103 and any suitable dimensions for elements in each VNOR memory string.

Conformal insulator layer 106 (e.g. silicon oxide) may be provided on the sidewalls of $n^+$ polysilicon pillars 104 and 105. Insulator-filled channel slot 109 (e.g., silicon oxide), extending along the Z-direction down to bottom of the 3-dimensional array, is provided between $n^+$ polysilicon pillars 104 and 105. Conformally deposited $p^-$ polysilicon layer 108—which is designated to become channel regions of the storage transistors in the VNOR memory string—is deposited over insulator-filled channel slot 109. Conformally deposited storage layer (e.g., an oxide-nitride-oxide ("ONO") charge-trapping layer) 107 is provided over conformally deposited $p^-$ polysilicon layer 108. The oxide-nitride-oxide triple layer provides a tunneling layer, a charge-trapping layer and a blocking layer, respectively. One of $n^+$ polysilicon pillars 104 and 105 is electrically contacted through 80-nm wide via connection 110 by a 50-nm wide conductor 111 in an interconnection conductor layer. Conductor 111 provides a global bit line to connect multiple selected $n^+$ polysilicon pillars 105. In each VNOR memory string, the contacted one of $n^+$ polysilicon pillars 104 and 105 serves as the common bit line, while the non-contacted one of $n^+$ polysilicon pillars 104 and 105 serves as the common source line.

FIGS. 2(a)-2(j) illustrate a process for fabricating modular circuits 101-1 and 101-2, according to one embodiment of the present invention. Each of FIGS. 2(a)-2(j) includes both top view (i.e., X-Y plane) 201-1 and cross-section view (i.e., Z-X plane) 202-2; cross-section view 202-2 is a Z-X plane cross-section along line B-B' in top view 201-1.

Figures 2A, 2B:
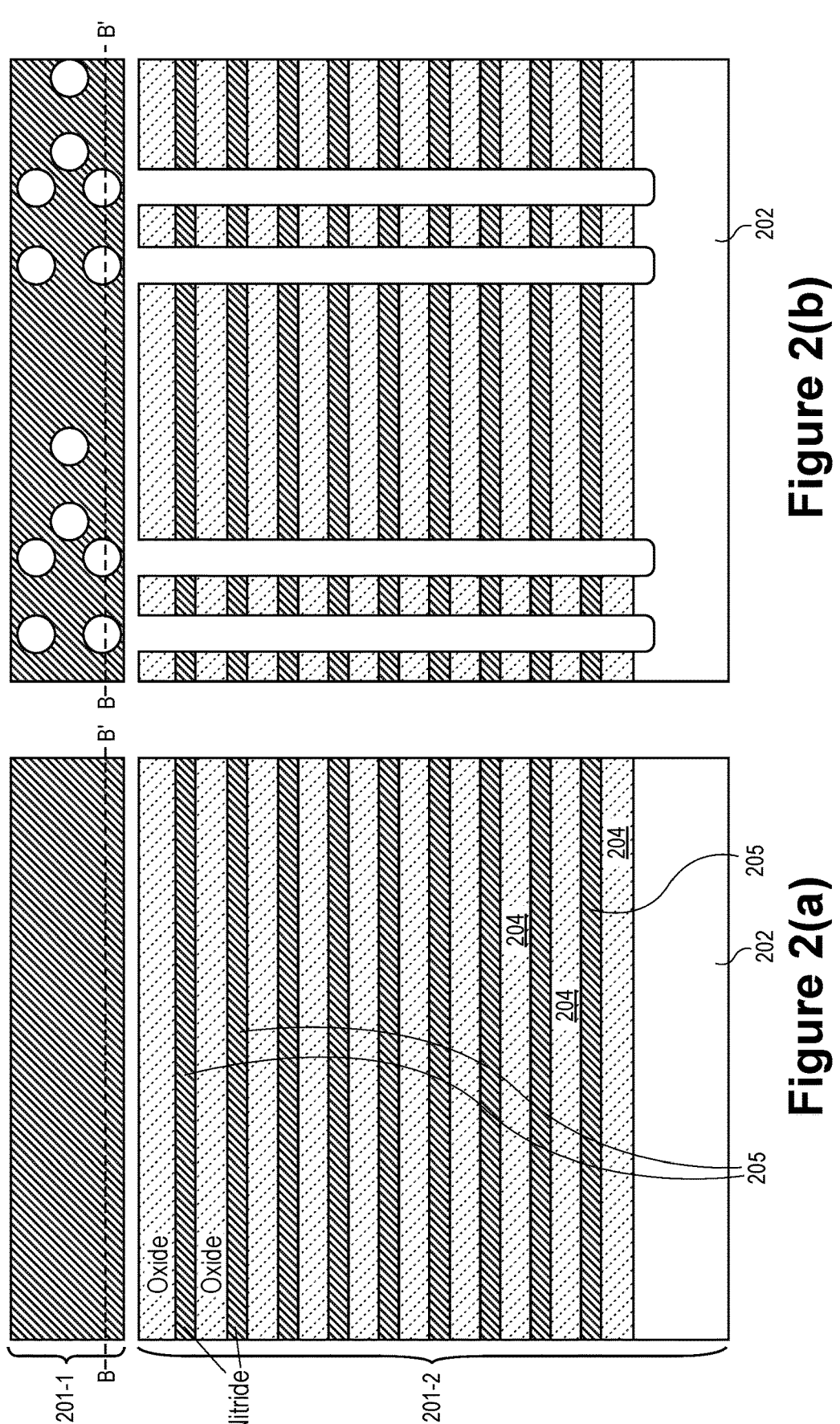

Initially, as shown in FIG. 2(a), alternate layers of silicon oxide 204 and silicon nitride 205 are deposited over the planar surface of semiconductor substrate 202. In some embodiments, prior to depositions of silicon oxide layers 204 and silicon nitride layers 205, circuitry for supporting memory operations has already been formed at or near the planar surface of semiconductor substrate 202. Such circuitry may include, for example, various voltage sources, sense amplifiers, error detection and correction circuitry, registers, latches, and various other logic circuits. Silicon nitride layers 205 serve as sacrificial layers, which are each to be replaced at a subsequent step by a conductor (e.g., tungsten (W) with a titanium nitride (TiN) adhesive liner).

Thereafter, as shown in FIG. 2(b), successive oxide and nitride etches create source and drain shafts 206, each having a diameter, for example, of 100 nm. In some embodiment, a final silicon etch allows the bottoms of source and drain shafts 206 to reach into semiconductor substrate 202.

Figures 2C, 2D:
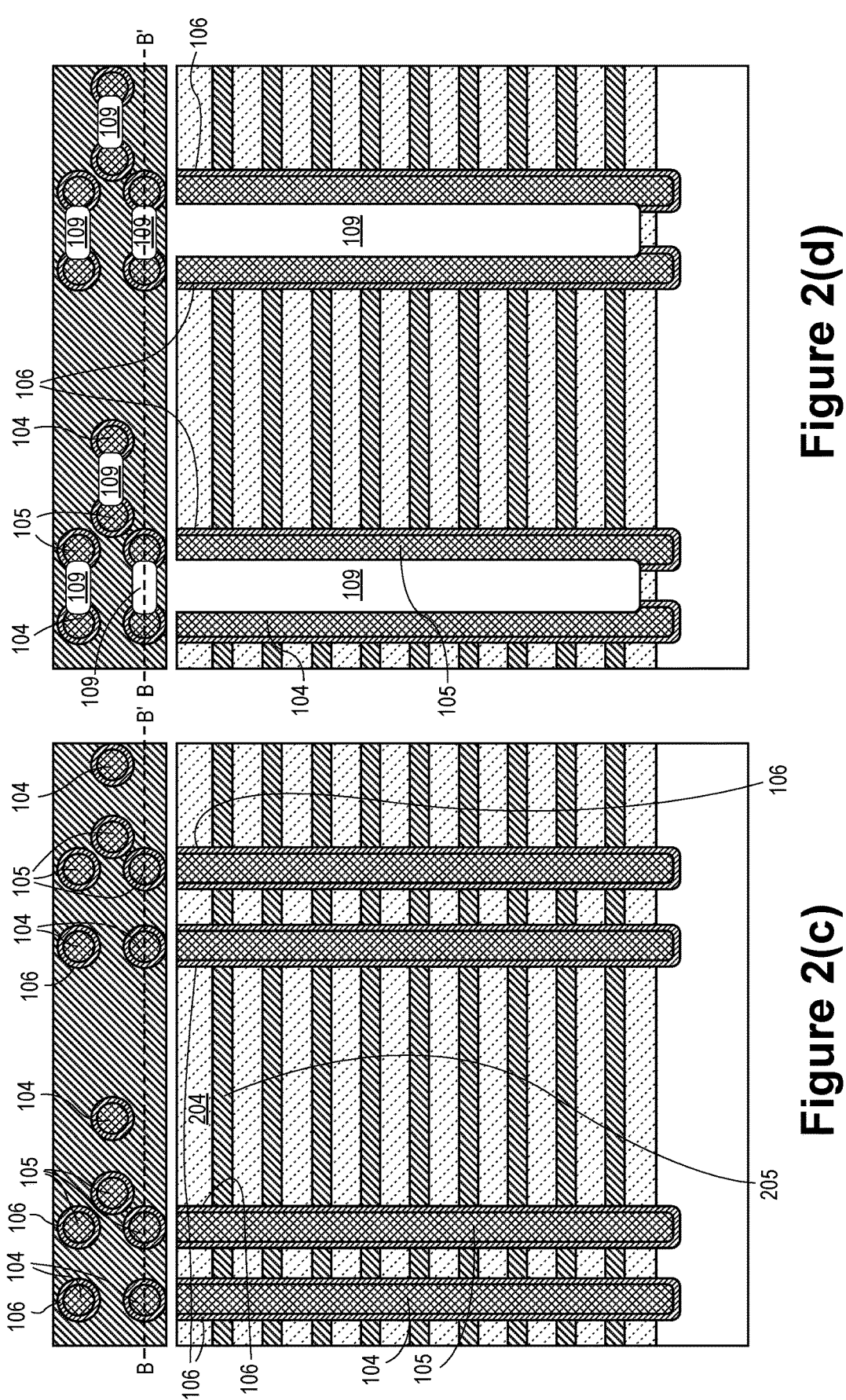
Figures 2E, 2F:
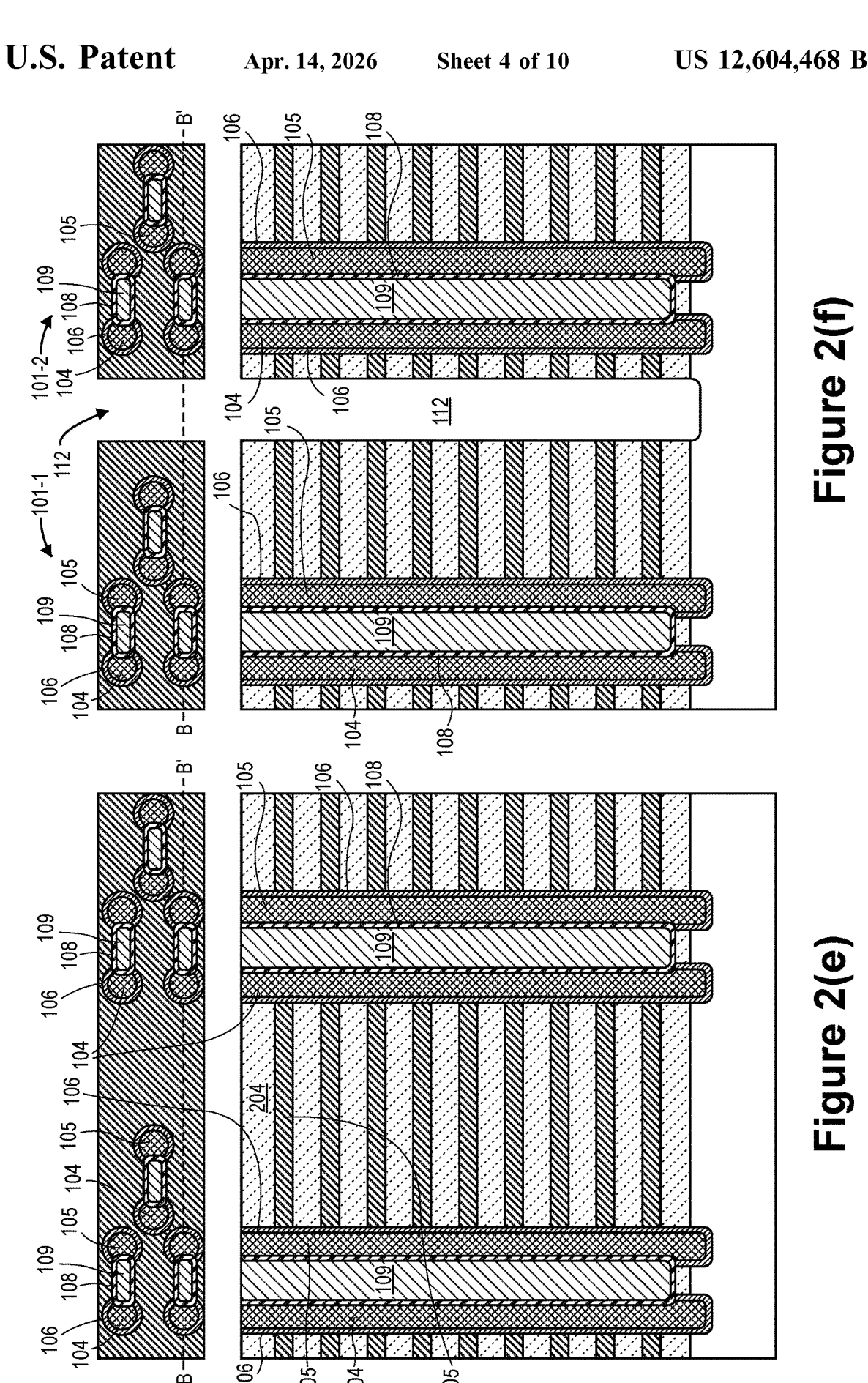
Figure 2H:
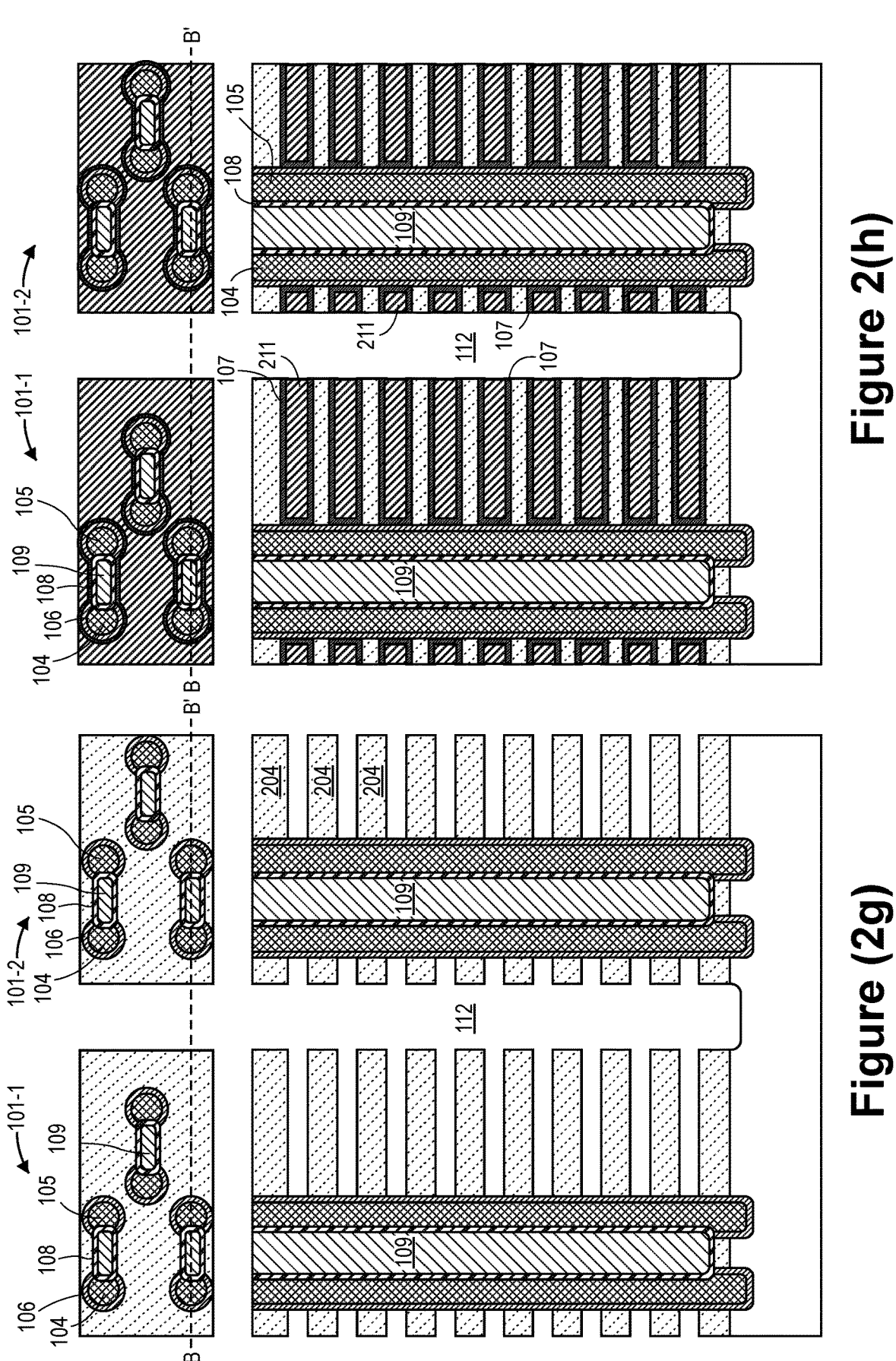
Figures 2I, 2J:
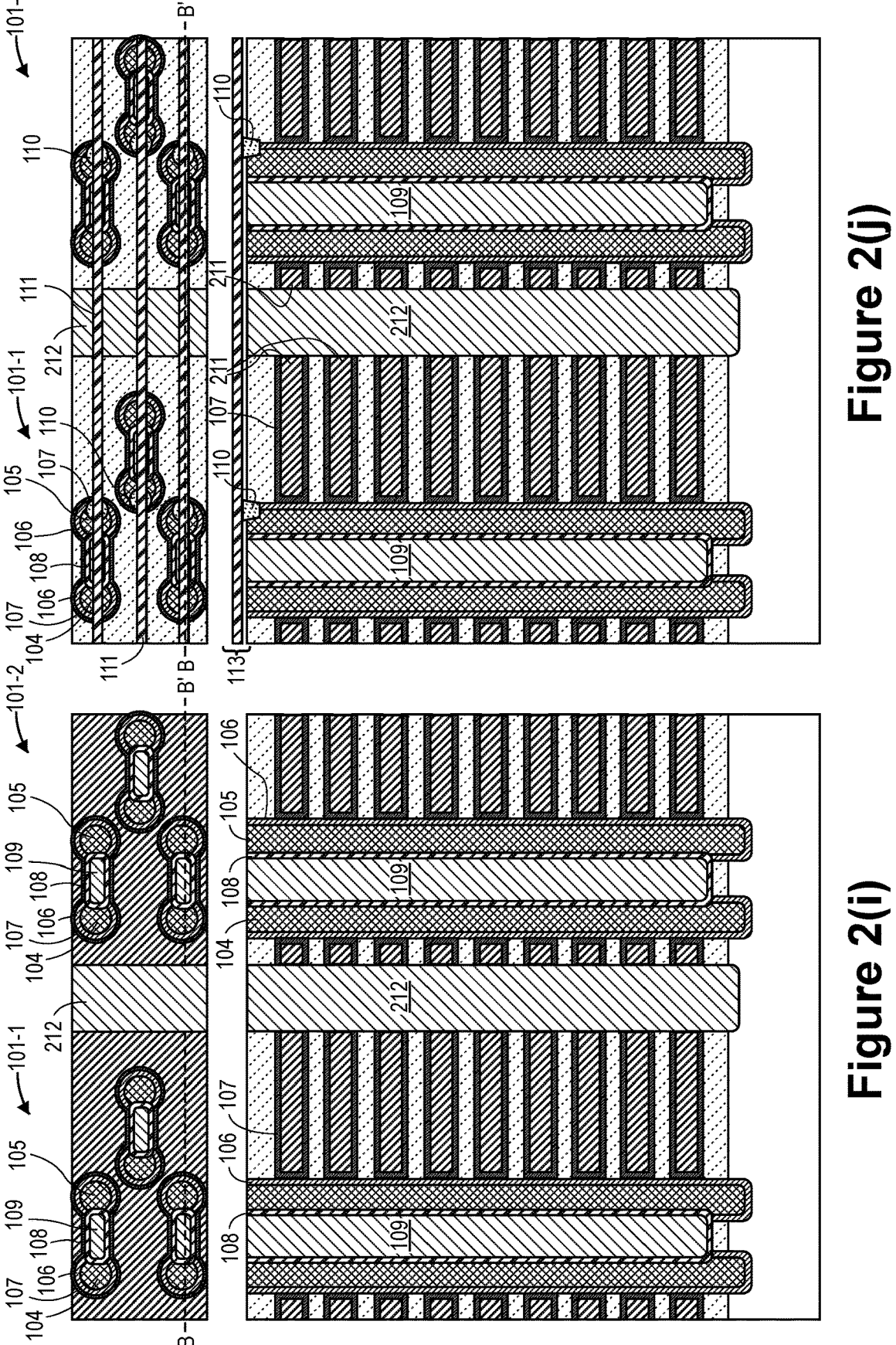

Insulator layer (e.g., silicon oxide) 106 is then conformally deposited on the sidewalls and the bottom of source and drain shafts 206, which are then filled by $n^+$ polysilicon to create $n^+$ polysilicon 104 and 105. A chemical-mechanical polishing (CMP) step removes excess the insulator and the $n^+$ polysilicon from top oxide layer 204. The resulting structure is shown in FIG. 2(c). In some embodiments, rather than filling source and drain shafts 206 with $n^+$ polysilicon, an $n^+$ polysilicon liner may be used to line source and drain shafts 206. In that case, source and drain shafts 206 are then filled by a metal (e.g., a tungsten plug) to reduce resistance in the resulting common bit line or the resulting common source line. A chemical-mechanical polishing (CMP) step removes excess insulator and $n^+$ polysilicon from the top oxide layer 204.

Successive oxide and nitride etches then create oval channel slots 109, each channel slot having a major axes that is, for example, 100 nm long. Channel slot 109 may reach into the bottom oxide layer 204, as shown in FIG. 2(d).

Conformal layer 108—either intrinsic polysilicon or p⁻-doped polysilicon—is then deposited on the sidewalls and the bottom of each of channel slots 109, followed by filling of each channel slot by an insulator material (e.g., silicon oxide). If conformal layer 108 is sufficiently thin, conformal layer 108 can operate as fully depleted channel region even when implemented by intrinsic polysilicon. A CMP step removes excess insulator and p⁻ polysilicon from the top oxide layer 204. The resulting structure is shown in FIG. 2(*e*).

Slit trenches 112, each 150 nm wide, may then be formed to isolate modular circuits (e.g., modular circuits 101-1 and 101-2) from each other and to facilitate replacement of silicon nitride 205 by a conductor. The resulting structure is shown in FIG. 2(*f*).

An isotropic silicon nitride etch then removes silicon nitride layers 205, facilitated by slit trenches 112. A trim step (e.g., an oxide trim step) then removes part of silicon oxide layers 204 to ensure that space vacated by silicon nitride layers 205 is sufficiently cleared for conductor replacement (e.g., by TiN-lined W layers), taking care that insulator layer 106 on the sidewalls of n⁺ polysilicon pillars 104 and 105 is not removed. The resulting structure is shown in FIG. 2(*g*).

Thereafter, storage layer (e.g., an ONO charge-trapping layer) 107 is conformally deposited. TiN liner is then conformally deposited over storage layer 107. Conductor (e.g., metallic tungsten) 211 then fills the space vacated by silicon nitride layers 205—forming the word lines—as well as all or part of slit trenches 112. An anisotropic etch-back step then removes the conductor from slit trenches 112 and to separate the word lines. The resulting structure is shown in FIG. 2(*h*).

Slit trenches 112 are then filled with insulator material (e.g., silicon oxide) 212 using, for example, a shallow trench fill technique. Excess oxide on the surface may then be removed by CMP. The resulting structure is shown in FIG. 2(*i*). Isolation layer (e.g., a silicon oxide layer) 113 is then deposited. Conductor-filled vias 110 are then created in isolation layer 113 to contact n polysilicon pillars 105 (i.e., those n⁺ polysilicon pillars designated to serve as the common bit lines of the VNOR memory strings). Conductors 111 in an interconnection conductor layer over isolation layer 113 are then formed to provide global bit lines to connect the common bit lines of the VNOR memory strings. The resulting structure is shown in FIG. 2(*j*). In some embodiments, prior to depositing isolation layer 113, top oxide layer 204 is etched back and an etch-stop layer may be provided. The etch stop layer prevents conductor filled-vias 110 from being formed sufficiently deep as to short via connections 110 to the top conductor layer 211 of the word lines.

In some embodiments, to reduce leakage in the p⁻ polysilicon at the bottom of each of channel slots 109, a layer of liner oxide is deposited by atomic layer deposition (ALD) on the p⁻ polysilicon, so as to protect the p⁻ polysilicon on the sidewalls (i.e., the p⁻ polysilicon designated for channel regions). Then, an anisotropic etch step removes the ALD liner at the bottom of each of channel slots 109, followed by a wet etch that removes the p⁻ polysilicon at the bottom of the channel slot. FIGS. 2(*e*-1) to 2(*j*-1) show the alternative structures for the structures shown in FIGS. 2(*e*) to 2(*j*).

Figure 3A:
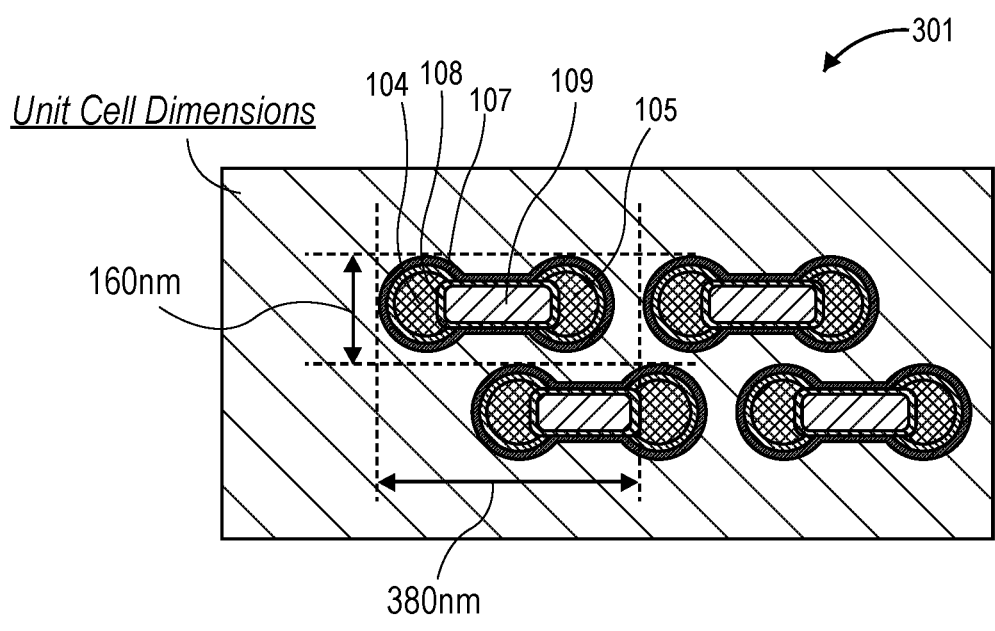
FIG. 3(a) shows unit cell 301, including four VNOR memory strings, according to an alternative embodiment of the present invention.
Figure 3B:
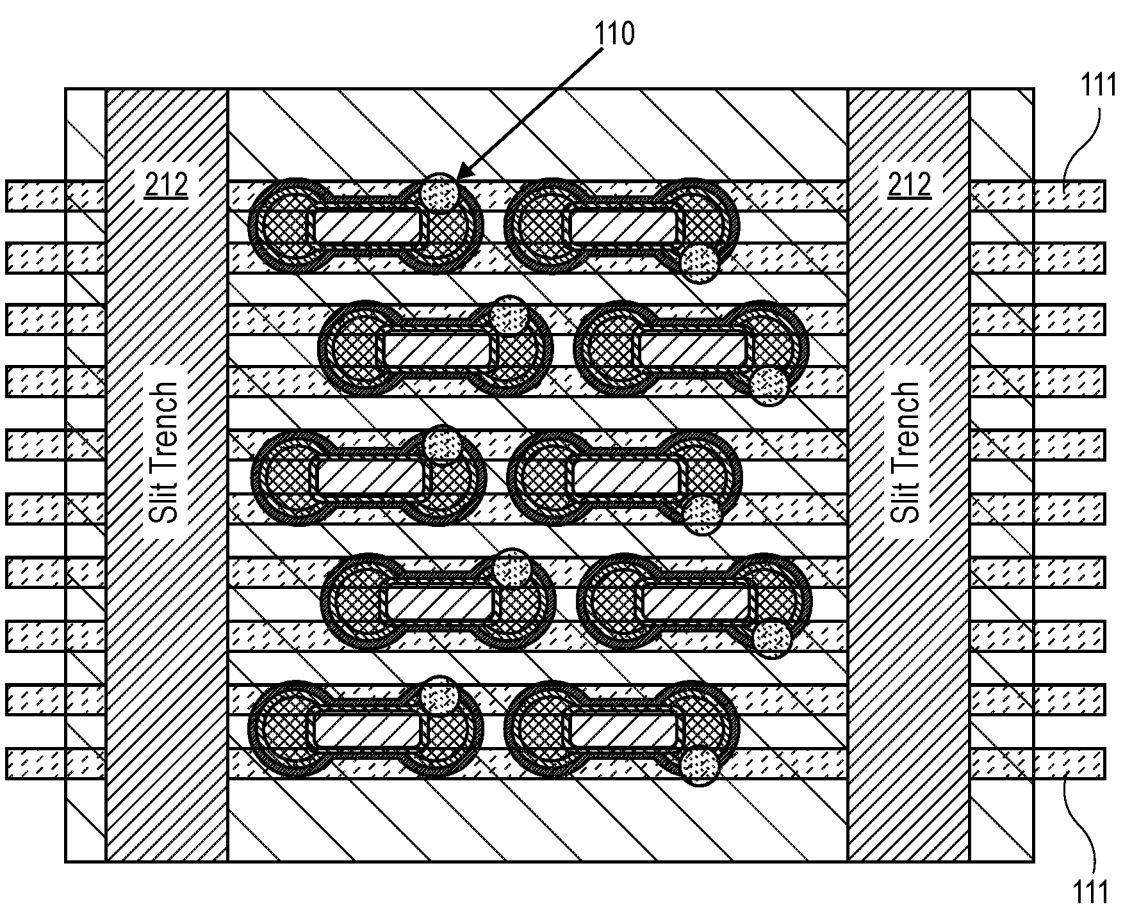
FIG. 3(b) shows top view of modular circuit 302 of FIG. 3(a), formed using unit cell 301 as a building block, in accordance with the alternative embodiment of the present invention.

FIG. 3(*a*) shows top view of unit cell 301, including four VNOR memory strings, according to an alternative embodiment of the present invention. In one embodiment, each VNOR memory string in unit cell 301 may be served by up to 96 word lines. As shown in FIG. 3(*a*), each VNOR memory string extends 380 nm along the X-direction and 160 nm along the Y-direction, with adjacent rows offset from each other by 80 nm along the X-direction. FIG. 3(*b*) shows top view of modular circuit 302 having 140 nm wide slit trenches 112 and 40-nm wide conductors 111 serving as global bit lines, contacting each VNOR memory string at a 60-nm diameter conductor-filled via.

The above detailed description is provided to illustrate specific embodiments of the present invention and is not intended to be limiting. Numerous variations and modifications within the scope of the present invention are possible. The present invention is set forth in the accompanying claims.

We claim:

1. A VNOR memory string, comprising:
a plurality of first and second pillars embedded in multiple composite layers that are formed above a planar surface of a semiconductor substrate, each composite layer comprising an insulator layer and a conductor-containing layer, wherein each conductor-containing layer comprises a conductor and wherein the each of the first pillars and the second pillars comprise a first semiconductor layer of a first conductivity;
a plurality of third pillars also embedded in the composite layers, each third pillar being formed between a pair of the first and the second pillars;
a second semiconductor layer of a second conductivity type opposite the first conductivity type provided on the sidewall of each third pillar, the second semiconductor layer contacting both the first and second pillars that are formed on the sides of the respective third pillar;
a storage layer provided conformally in the conductor-containing layer of each composite layer, such that a portion of the storage layer is provided between the second semiconductor layer and the conductor in each conductor-containing layer, and such that the storage layers of different ones of the composite layers are separated from each other, and each portion of the storage layer encircles the first, second and third pillars within each conductor-containing layer and is separated from different ones of the portions of the storage layer encircling other sets of first, second and third pillars; and
a third insulator layer encircling each of the first and second pillars except at a portion where each of the first and second pillars contacts the respective second semiconductor layer formed on the third pillar, wherein the third insulator layer is provided between the respective first or second pillar and the storage layer without intervening layers.

2. The VNOR memory string of claim 1, wherein each of the third pillars further comprises a second insulator layer enclosed by the second semiconductor layer.

3. The VNOR memory string of claim 1, wherein the insulator layers in the composite layers each comprise silicon oxide.

4. The VNOR memory string of claim 1, wherein the first semiconductor layer and the second semiconductor layer comprise n⁺ polysilicon and p⁻ polysilicon, respectively.

5. The VNOR memory string of claim 1, wherein the storage layer comprises a charge-trapping layer.

6. The VNOR memory string of claim 5, wherein the charge-trapping layer comprises a silicon oxide layer, a silicon nitride layer and a silicon oxide layer.

7. The VNOR memory string of claim 1, wherein the conductor layers of the composite layers each comprise metallic tungsten (W) in conjunction with a titanium nitride (TiN) liner.

8. The VNOR memory string of claim 1, further comprising an isolation layer and a conductor-filled via formed therein, the conductor-filled via contacting the first semiconductor layer in one of the first and second pillars in each set of the first and second pillars.

9. The VNOR memory string of claim 8, further comprising an etch-stop layer above a conductor layer in the composite layers.

10. The VNOR memory string of claim 1, wherein each of the third pillars extends into the insulator layer of the composite layers closest to the planar surface of the semiconductor substrate.

11. The VNOR memory string of claim 1, wherein each of the plurality of the first and second pillars extend into the semiconductor substrate.

12. The VNOR memory string of claim 1, wherein circuitry for supporting memory operations are formed at or near the planar surface of semiconductor substrate.

13. The VNOR memory string of claim 1, wherein the second semiconductor layer is provided on the sidewall of each third pillar and is removed at a bottom of the respective third pillar.

* * * * *